March 17, 1964 B. J. ZAJAC ETAL 3,125,687

PARAMETRIC AMPLIFIER

Filed Jan. 31, 1962

INVENTORS
BLAIR J. ZAJAC
HENRY SHENKER

BY Glenn S. Ovrevik Agent
Richard C. Reed
ATTORNEY

United States Patent Office 3,125,687 Patented Mar. 17, 1964

3,125,687
PARAMETRIC AMPLIFIER

Blair J. Zajac, Washington, D.C., and Henry Shenker, Alexandria, Va., assignors to the United States of America as represented by the Secretary of the Navy Filed Jan. 31, 1962, Ser. No. 170,291
4 Claims. (Cl. 307—88)
(Granted under Title 35, U.S. Code (1952), sec. 266)

The invention described herein may be manufactured and used by or for the Government of the United States of America for governmental purposes without the payment of any royalties thereon or therefor.

This invention relates in general to solid state devices and in particular to low frequency parametric amplifiers.

As is well known in the art low frequency parametric amplifiers are generally characterized by low noise, by a high input impedance and by a low output impedance and are often utilized in sensing applications, i.e., voltmeters, transducers, computers, field measurement means and the like where low noise and high input impedance characteristics are particularly desirable. Unfortunately, prior art parametric amplifiers are generally characterized also by a relatively low voltage gain, nominally one or less. It will be appreciated that a parametric amplifier having a more useful voltage gain characteristic is needed and would be welcomed as a substantial advancement of the art.

Accordingly, it is an object of this invention to provide an improved parametric amplifier having a voltage gain characteristic substantially greater than one.

It is another object of this invention to provide an improved parametric amplifier which is lightweight and compact.

It is still another object of this invention to provide an improved parametric amplifier which has relatively low power requirements.

It is a further object of this invention to provide an improved parametric amplifier which is relatively inexpensive to produce.

Other objects of this invention will become apparent upon a more comprehensive understanding of the invention for which reference is had to the following specifications and drawing wherein.

Figures 1, 2, 3, 4:
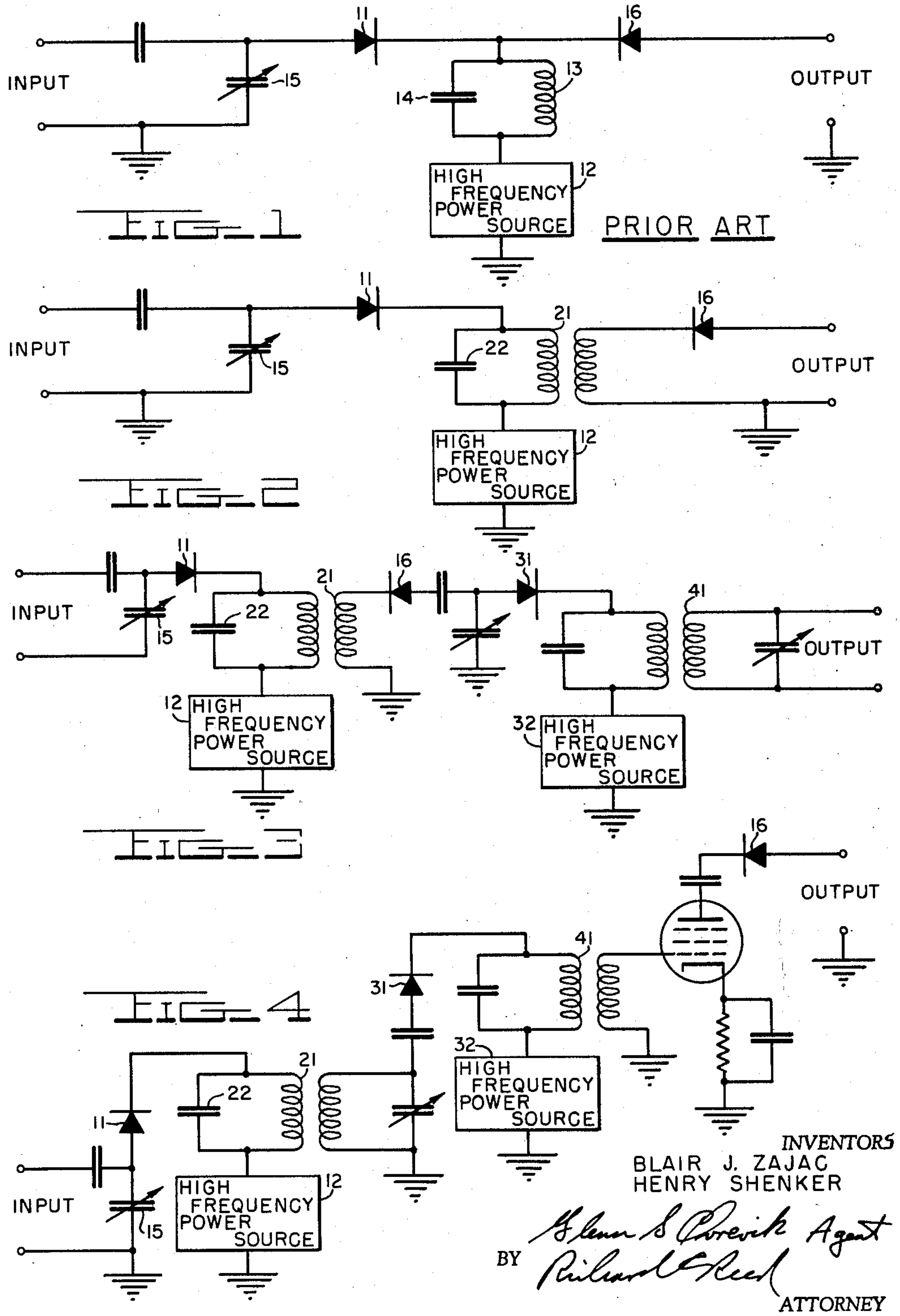
FIG. 1 is a schematic showing of a typical prior art parametric amplifier over which the present invention is an improvement.
FIG. 2 is a schematic showing of one embodiment of the present invention.
FIG. 3 is a schematic showing of a second embodiment of the present invention.
FIG. 4 is a schematic showing of a third embodiment of the present invention.

Briefly, the device of this invention is an improved parametric amplifier wherein transformer means having optimum performance characteristics at the pump frequency are incorporated such that voltage amplification is obtained prior to demodulation of the signal in the output stage.

Referring now to the drawings in more detail:

FIG. 1 is a typical parametric amplifier of the prior art employing a solid state device 11, for example, a silicon diode having very low reverse leakage and low capacitance; means for self biasing the solid state device 11, in this embodiment power source 12 having a constant voltage and frequency output, and operating at a pump frequency of about 30 mc. which is applied to the solid state device via a series parallel resonant circuit, inductance 13, capacitance 15 and capacitance 14; input means for applying an input signal to the solid state device 11; and demodulation means 16 which in the depicted embodiment is a germanium diode IN60, IN64 or the equivalent.

In operation, the tank circuit, inductance 13 and capacitance 14, is tuned below or above resonance on the linear portion of the resonance curve. In this arrangement, the output signal is in phase or 180° out of phase with the input signal depending upon which side of resonance is chosen as the operating point.

It will be appreciated that the prior art device shown in FIG. 1 despite notable characteristics of low noise and high input impedance affords a stable voltage gain less than one and thus requires supplemental voltage amplification in most applications of the device.

The embodiment of the present invention shown in FIG. 2 is similar to the prior art embodiment of FIG. 1 in that it employs a comparable solid state device 11 and a comparable means for self biasing the solid state device 11, a power source 12. The embodiment of FIG. 2 also may incorporate a similar demodulation means 16, as shown, but in this embodiment the demodulation means 16 is not directly connected to the solid state device 11. Rather, in accordance with the teachings of the present invention, a transformer 21 operating at the pump frequency, that is, at the frequency of the power source 12, interconnects the solid state device 11 and the demodulation means 16.

It will be appreciated that the transformer 21 is an integral part of the embodiment of FIG. 2 and serves several functions therein. For example, the primary winding of the transformer 21 and the capacitance 22 comprise a tuned circuit which serves to apply the pump frequency output of the source 12 to the solid state device 11. Of course, the device of this invention is not limited to the use of the type of transformer exemplarily shown in FIG. 2 and other types of transformers which are designed to produce a significant voltage gain at the pump frequency might be substituted therefor. For example, an auto transformer design might be employed, if desired.

Considering the case of an ideal transformer, the output impedance ($T^{Z}_{out}$) of the circuit is given by $$T^{Z}_{out}=A^2Z_{out}$$

where $Z_{out}$ is the output impedance of the solid state device (without a transformer) and A is the voltage gain of the transformer. In general, the transformer will not be able to provide much gain unless Z load (the input impedance of the next stage) is equal to or greater than $Z_{out}$.

In some instances, the output impedance $Z_{out}$ may be such that even with a large transformer ratio impedance matching is difficult and/or the voltage gain of one stage is insufficient for practical use without additional voltage amplification after demodulation. A desirable way to overcome these problems without a substantial increase in size and weight is to incorporate another parametric amplifier in cascade connection such as shown in FIG. 3.

In the embodiment of FIG. 3, the solid state device 31, the power source 32 and the transformer 41 which may be substantially identical to the solid state device 11, power source 12 and transformer 21, is connected to the output of the demodulation means 16. In operation, the two solid state devices 11 and 31 may be biased at the same or different pump frequencies, to function as a parametric amplifier and an impedance matching means, respectively.

Alternatively, the solid state device 31, power source 32 and the transformer 41 may be connected between the output of the transformer 21 and the demodulation means 16 as shown in the embodiment of FIG. 4. In the embodiment of FIG. 4, the parametric amplifier comprising solid state device 31, power source 32 and transformer 41 serves not only to amplify, but to isolate the first parametric amplifier and the demodulation means 16.

To avoid interaction complications in the embodiment of FIG. 4, it has been found advisable to select two widely separated pump frequencies for the energization of solid state devices 11 and 31, for example, 30 mc. and 200 mc., respectively.

Thus, in the embodiment of FIG. 4 with the additional amplification of the input signal prior to demodulation, noise complications at the demodulation stage are at a relatively low voltage level compared to the voltage level of the amplified input signal and the low noise characteristic of the overall device is enhanced.

It will be appreciated that the embodiments exemplarily shown in the drawings are merely illustrative of several selected means for accomplishing the objectives of the invention in accordance with the basic teaching of the invention as disclosed herein. In particular, the invention is not restricted to the particular solid state means disclosed nor to the particular self biasing means disclosed in connection therewith.

Further, in the cascade connected embodiments of FIG. 3 and FIG. 4, it is appreciated that the several parametric amplifiers in each embodiment may differ if desired and that more than two parametric amplifiers may be interconnected in accordance with the teachings of this invention in such embodiments where a greater effect is to be obtained.

What is claimed is:

1. An improved parametric amplifier for amplification of a modulated wave energy signal within a selected operational frequency range comprising, solid state means of the variety which embodies a power gain to an input signal when said solid state means is subjected to energization at a selected frequency level, said solid state means including signal input means for applying a modulated wave energy signal thereto; energization means for energizing said solid state means at said selected frequency level; demodulation means adapted for utilization of modulation information in said modulated wave energy; transformer means having at least an input winding and an output winding with the impedance of said output winding substantially greater than the impedance of said input winding; capacitance means electrically connected across said input winding of said transformer means to form a tuned circuit therewith which is tuned to the frequency of the output of said energization means; means connecting said input winding of said transformer means and said energization means in series across said solid state means; and means connecting said output winding of said transformer means across said demodulation means.

2. An improved parametric amplifier as defined in claim 1 wherein said means connecting said output winding across said demodulation means includes impedance matching means.

3. An improved parametric amplifier as defined in claim 2 wherein said impedance matching means includes a second solid state means of the variety which embodies a power gain to an input signal when said second solid state means is subjected to energization at a second selected frequency level; second energization means for energizing said second solid state means at said second selected frequency level; second transformer means having at least an input winding and an output winding with the impedance of said output winding substantially greater than the impedance of said input winding thereof; second capacitance means electrically connected across said input winding of said second transformer means to form a second tuned circuit therewith which is tuned to the frequency of the output of said second energization means; means connecting said input winding of said second transformer means and said second energization means in series across said second solid state means; and means connecting said output winding of said second transformer means across said demodulation means.

4. An improved parametric amplifier as defined in claim 3 wherein the selected frequency level of the first said energization means and the selected frequency level of said second energization means are substantially separated.

No references cited.